United States Patent
Ko

[19]

[11] Patent Number: 6,087,886
[45] Date of Patent: Jul. 11, 2000

[54] HYBRID DUAL THRESHOLD TRANSISTOR MULTIPLEXER

[75] Inventor: Uming Ko, Plano, Tex.

[73] Assignee: Texas Instruments Incorporated, Dallas, Tex.

[21] Appl. No.: 09/288,204

[22] Filed: Apr. 8, 1999

Related U.S. Application Data

[62] Division of application No. 09/050,401, Mar. 30, 1998.
[60] Provisional application No. 60/042,892, Mar. 31, 1997.

[51] Int. Cl.[7] .................................................. H03K 17/56
[52] U.S. Cl. ........................................... 327/408; 327/407
[58] Field of Search ..................................... 327/202, 203, 327/407, 408, 411, 427, 430, 431, 434, 435

[56] References Cited

U.S. PATENT DOCUMENTS

| | | | |
|---|---|---|---|
| 5,376,829 | 12/1994 | Rogers et al. ............................ | 327/408 |
| 5,625,303 | 4/1997 | Jamshidi .................................. | 326/106 |

Primary Examiner—Tuan T. Lam
Attorney, Agent, or Firm—Robert D. Marshall, Jr.; W. James Brady, III; Frederick J. Telecky, Jr.

[57] ABSTRACT

This invention deals with various circuits using transistors having two different threshold voltages designated high threshold voltage (HVT) and low threshold voltage (LVT). These circuits employ the know faster response time of LVT transistors while substantially avoiding the known greater leakage current of LVT transistors. A two input multiplexer includes two transmission gates driven in opposite phases by a selection control signal. One transmission gate, preferably the transmission gate most often selected, includes LVT transistors while the other transmission gate includes HVT transistors. A hybrid threshold voltage D flip-flop circuit employs LVT transistors in input transmission gates of both a master latch and a slave latch. In a conventional circuit, the output invertor of the slave latch also includes LVT transistors. In a split slave dual path circuit, the intermediate inverter also includes LVT transistors. In a push-pull output register, the inverter and transmission gate of the push-pull circuit may include LVT transistors. In a first alternative, only the transmission gates in the push-pull circuit and the slave latch include LVT transistors. In a second alternative, only the inverter on the push-pull circuit and the output inverter of the slave latch include LVT transistors. In a third alternative, the push-pull circuit is a hybrid threshold voltage tri-state inverter.

8 Claims, 5 Drawing Sheets

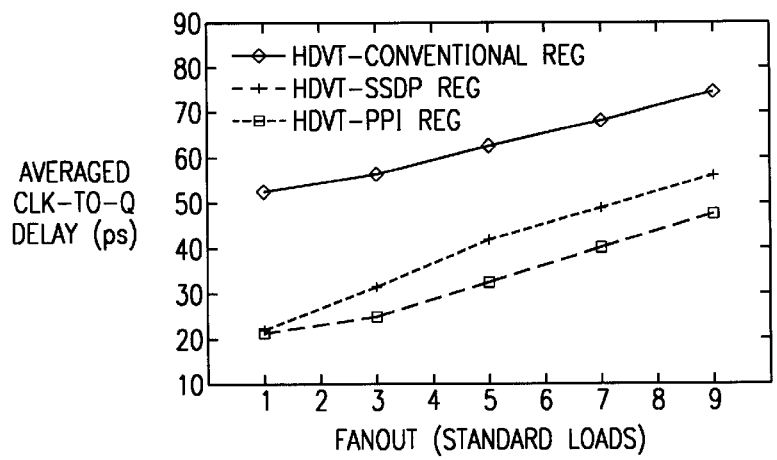
FIG. 6
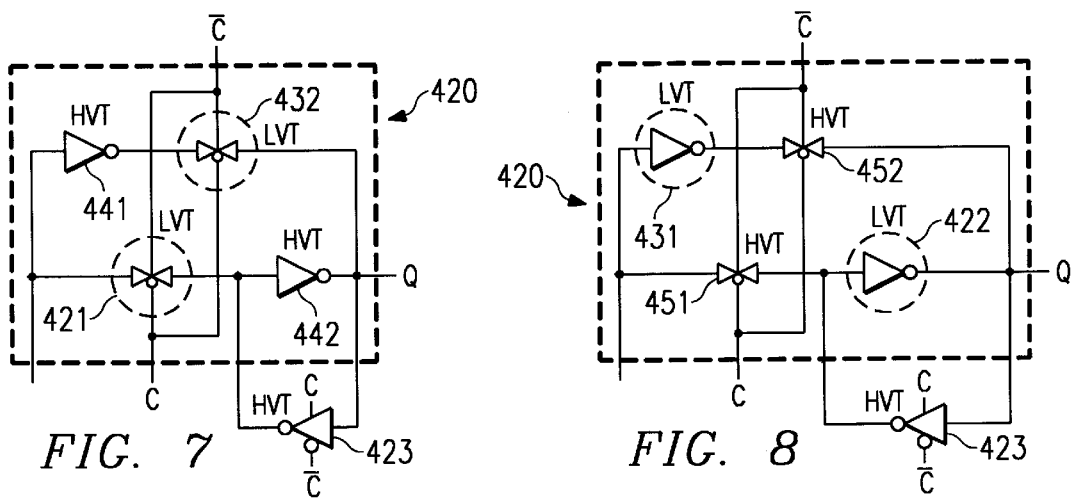
FIG. 7
FIG. 8
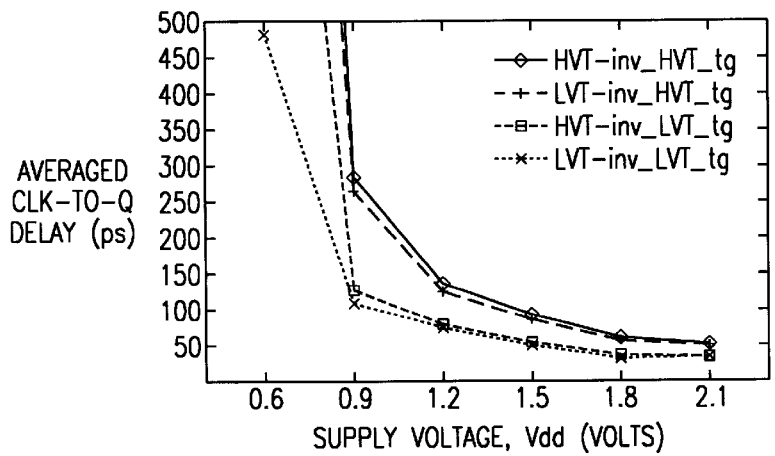
FIG. 9

HYBRID DUAL THRESHOLD TRANSISTOR MULTIPLEXER

CROSS-REFERENCES TO RELATED APPLICATIONS

This application claims priority under 35 U.S.C. 119(e)(1) of provisional application Ser. No. 60/042,892, filed Mar. 31, 1997. This application is a divisional of U.S. patent application Ser. No. 09/050,401 filed Mar. 30, 1998, now U.S. Pat. No. 5,982,211 issued Nov. 9, 1999.

This application is related to the following patent applications, each of which is hereby incorporated herein by reference:

U.S. patent application Ser. No. 08/687,800, now U.S. Pat. No. 5,831,451 entitled "DYNAMIC LOGIC CIRCUITS USING TRANSISTORS HAVING DIFFERING THRESHOLD VOLTAGES", with inventor Patrick W. Bosshart, and filed Jul. 19, 1996, now U.S. Pat. No. 5,851,451 issued Nov. 3, 1998;

U.S. patent application Ser. No. 08/683,996, now U.S. Pat. No. 5,821,778 entitled "DYNAMIC LOGIC CIRCUITS USING CASCODE TRANSISTORS HAVING LOW THRESHOLD VOLTAGES", with inventor Patrick W. Bosshart, and filed Jul. 19, 1996, now U.S. Pat. No. 5,821,778 issued Oct. 13, 1998; and U.S. patent application Ser. No. 08/684,369, now U.S. Pat. No. 5,815,005 entitled "POWER REDUCTION CIRCUITS AND SYSTEMS FOR DYNAMIC LOGIC GATES", with inventor Patrick W. Bosshart, and filed Jul. 19, 1996, now U.S. Pat. No. 5,815,005 issued Sep. 29, 1998.

TECHNICAL FIELD OF THE INVENTION

The technical field of this invention is register circuit configurations and are more particularly register circuits using transistors having differing threshold voltages.

BACKGROUND OF THE INVENTION

In many modern circuit applications, it is desirable to increase the speed of operation of the circuit application. For example, in microprocessor design the circuits which make up speed-limiting portions or affect the speed of the microprocessor are constantly scrutinized and re-designed to increase the overall microprocessor speed. Increased speed increases performance and, therefore, permits more detailed and sophisticated processing capabilities in a shorter amount of time. It is known in the CMOS manufacturing art to target the threshold voltage of transistors given certain circuit expectations. Particularly, typically a manufacturer will build transistors, or make available transistor fabrication processes, which include transistors of a given threshold voltage. When providing this process, the manufacturer typically considers the tradeoff in speed improvement versus power consumption. To increase operational speed, it is known that the threshold voltage of all of the transistors within a circuit may be reduced. By reducing the threshold voltage, the drive current of these transistors is increased. However, the leakage current of those same transistors is also increased. This approach becomes even more limiting as power supply voltages are reduced and the threshold voltage of the transistor becomes a greater percentage of the power supply voltage. Consequently, one approach is to lower the threshold voltage of the transistor but this increases current leakage and therefore also increases overall standby power consumption. Thus, often a manufacturer anticipates a certain level of leakage to be the acceptable limit, and in view of that limit, adjusts known parameters so that each of the transistors of the circuit share a designated threshold voltage which will provide that limit.

As MOSFET process technology continues to scale to smaller transistors, both gate length and gate oxide thickness decrease. This mandates a supply voltage ($V_{dd}$) reduction to maintain MOSFET gate integrity. Although power dissipation is decreasing favorably according to $V_{dd}^2$ due to scaling, the propagation delay degrades proportional to ($V_{dd}-V_t$). Thus, to both enhance performance and reduce power dissipation, multiple-threshold-voltage MOSFETs are crucial for deep sub-micron CMOS processes, especially when $V_{dd}$ is in the one volt range. However, the LVT MOSFET must be applied to the circuit architecture judiciously to maintain proper noise immunity and to prevent excessive subthreshold leakage power dissipation which is detrimental to any power management techniques of an energy-sensitive microprocessor design.

While the above approaches are representative of the art for advancing circuit operational speed, they provide various limitations or drawbacks. For example, the logic speed is still limited by the threshold voltage of the transistors used in the logic. As another example, and as mentioned above, an advance in speed by reducing threshold voltage necessarily increases standby power consumption caused by leakage current. This invention provides increased circuit speed while reducing leakage current as compared to the current state of the art.

SUMMARY OF THE INVENTION

This invention deals with various circuits using transistors having two different threshold voltages designated high threshold voltage (HVT) and low threshold voltage (LVT). These circuits employ the know faster response time of LVT transistors while substantially avoiding the known greater leakage current of LVT transistors. A two input multiplexer includes two transmission gates driven in opposite phases by a selection control signal. One transmission gate, preferably the transmission gate most often selected, includes LVT transistors. The other transmission gate includes HVT transistors.

A hybrid threshold voltage D flip-flop circuit employs LVT transistors in transmission gates at the input of both a master latch and a slave latch. In a conventional circuit, the output invertor of the slave latch also includes LVT transistors. In a split slave dual path circuit, the intermediate inverter also includes LVT transistors. In a push-pull output register, the inverter and transmission gate of the push-pull circuit may include LVT transistors. Alternatively, only the transmission gates in the push-pull circuit and the slave latch include LVT transistors. As a further alternative, only the inverter on the push-pull circuit and the output inverter of the slave latch include LVT transistors. In a yet further alternative of the push-pull output register, the push-pull circuit is a hybrid threshold voltage tri-state inverter.

BRIEF DESCRIPTION OF THE DRAWINGS

These and other aspects of this invention are illustrated in the drawings, in which:

FIG. 6 is a graph illustrating the effect of differing loadings on the clock to output delay time of registers of this invention;

FIG. 7 illustrates alternative construction of the slave latch of the push pull isolation register illustrated in FIG. 5;

FIG. 8 illustrates another alternative construction of the slave latch of the push pull isolation register illustrated in FIG. 5;

FIG. 9 is a graph illustrating the effect of scaling the supply voltage on the clock-to-q delay of registers of this invention;

DETAILED DESCRIPTION OF PREFERRED EMBODIMENTS

Figure 1:
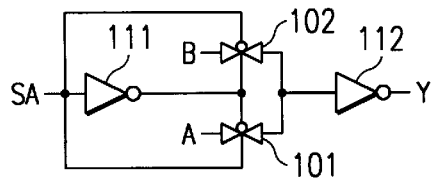
FIG. 1 illustrates a two input pass gate multiplexer in accordance with the prior art.

In the preferred embodiment, logic circuits are constructed of MOSFETs having two different threshold voltages ("$V_T$"). In this application, the Figures will may individually designate whether MOSFETs are constructed with a high threshold voltage (HVT) or with a low threshold voltage (LVT). Alternatively, the Figures may designate logic functions constructed with MOSFETS each of which are of either a high threshold voltage (HVT) type or of a low threshold voltage (LVT) type. The Figures will make clear which MOSFETs are constructed with these two threshold voltages.

Before detailing the significance of the use of a low threshold voltage transistor versus a high threshold voltage transistor, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. For the remainder of this application, a transistor of the first type will be referred to as an HVT transistor (i.e., a transistor with a relatively high $V_T$) while a transistor of the second type will be referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. It is known in the art that an LVT transistor provides the benefit of a higher drive current as opposed to an HVT transistor. It is also known in the art that a LVT transistor provides a greater leakage current than an HVT transistor. Indeed, the typical leaking by an LVT transistor may be greater than that of an HVT transistor by two or three orders of magnitude or more. In the prior art all of the transistors of a particular circuit were typically constructed to have the same high $V_T$. This high $V_T$ was selected to avoid the unacceptably large leakage current which would exist if a lower $V_T$ were used. The above referenced co-pending patent applications present a number of circuit types with mixed HVT and LVT transistors in which leakage current is minimized. This application presents additional circuits types having this same benefit.

Before proceeding with the benefits of the above-stated distinction where the present embodiments use both HVT and LVT transistors, note then that the embodiments described in this application may be constructed in various manners in order to accomplish different transistors having differing threshold voltages. As a first example, one manner of accomplishing this goal could be using a manufacturing process which specifically permits the creation of logic circuits using transistors having differing threshold voltages. For example, in current technology, typically a single semiconductor area (e.g. a wafer) is masked and the exposed areas are exposed to an implant which establishes the threshold voltage for the exposed transistor channels of a first conductivity type. For example, the $V_T$ of all n-channel transistors may be set by using this process. Repeating this process with a different mask set for sets the $V_T$ for all p-channel transistors. Thus, using two implant steps, the $V_T$ is set for both n-channel and p-channel transistors. Additionally, for both conductivity types, the depth and/or concentration of the implant used in this manner affects the level of the threshold voltage resulting from the exposure. Under current standards, a common transistor may have a $V_T$ on the order of 500 millivolts. The methodology, however, may be expanded to provide at least two different sets of transistors, where both sets have the same conductivity type but one set includes HVT transistors while the other includes LVT transistors. Using this expanded methodology, and for one conductivity type, a first set of masks could be used to create a set of HVT transistors in the appropriate locations while a second set of masks could be used to create a set of LVT transistors in differing locations. Thus, for a given transistor conductivity types, one implant would take place using the first set of masks to create the HVT transistors. Another implant would take place using the second set of masks to create the LVT transistors. Additionally, for the second transistor conductivity type, two more sets of masks and implants would be employed in a like manner. Moreover, to contrast with the 500 millivolt $V_T$ of the HVT transistors, current transistor technology may expect a $V_T$ on the order of 200 millivolts for an LVT transistor. Moreover, these values may vary according to various considerations known in the art. In addition to the above, note further that the formation and/or construction of an HVT transistor versus an LVT transistor may be accomplished by other techniques as well. As another example, some transistors are formed using what is known as silicon-on-insulator ("SOI") technology. In this technology, each SOI transistor includes a separate body connection. Typically, the body is either connected to a certain node, or is allowed to float. This separately available connection may be further used to accomplish the relative $V_T$ standards set forth in this application. Additional considerations in this regard may arise in the future once the levels of $V_{DD}$ fall below a diode forward-bias voltage level for such a transistor. Given current $V_{DD}$ levels, which are still considerably higher than a typical forward-bias voltage of about 0.8 volts, and where it is desired to create an LVT configuration, it is acceptable to disconnect the transistor body, thereby allowing it to float. Conversely, given the same $V_{DD}$, and where it is desired to create an HVT configuration, it is acceptable to connect the transistor body to ground for an n-channel transistor (or to $V_{DD}$ for a p-channel transistor). In addition to the above, note that at some point in the future $V_{DD}$ levels should fall to 0.5 volts or less and, therefore, fall considerably below a typical expected forward-bias voltage of 0.8 volts. In this instance, and where it is desired to create an LVT configuration, it will as before be acceptable to disconnect the transistor body, thereby allowing it to float. As a result, the threshold voltage of that transistor during the precharge phase is relatively low. In contrast, where it is desired to create an HVT configuration, the transistor body may be connected to the transistor's gate which is known to be off during the phase in which a high threshold voltage (e.g., during the precharge phase) is desired. For example, for an n-channel SOI transistor connected in this manner, the low gate voltage during precharge is also connected to the body of that transistor. As a result, the threshold voltage of that transistor during the precharge phase is relatively high. Indeed, a relatively higher $V_T$ also may be accomplished by connecting the transistor body to a potential which is non-enabling for the transistor (e.g., connect the body to ground for an n-channel transistor), or to the source of that transistor or to a different signal which is at ground during precharge. Still other techniques should be ascertainable by a person skilled in that art and the particular technique chosen need not be detailed herein. For example, there are currently manufacturing techniques used in static circuits where certain transistors may be LVT transistors while other transistors may be HVT transistors. This technique is used so that an entire area, such as a set of circuits on an entire circuit die, are constructed using LVT transistors to increase the speed of that set of circuits, but with the recognition that the area constructed in this fashion will have an increased amount of current leakage as compared to the remaining areas on the circuit die which are constructed using HVT transistors. Thus, by modifying this technique or using other techniques available to a person skilled in the art, for purposes of the present embodiments it need be possible that a given circuit may be constructed by intentionally specifying differing threshold voltages for different transistors with the choice of either LVT or HVT transistors within a circuit configuration guided by the embodiments set forth in this document.

Circuits using LVT devices are known to have a standby power which is orders of magnitude greater than circuits with HVT devices. This is due to the greater leakage current of LVT devices. Thus this application constrains the use of LVT devices to the following cases: i) situations in which LVT devices may be used without increasing the standby power, and ii) situations in which the greater speed of LVT devices is absolutely necessary to achieve the target performance. The following description of each embodiment will include an explanation of how the proposed circuit meets these constraint.

FIG. 1 illustrates a pass-transistor two input multiplexer in the prior art. This two input multiplexer is disclosed in U.S. patent application Ser. No. 08/736,465, now U.S. Pat. No. 5,955,912 filed Oct. 24, 1996 and entitled "MULTI-PLEXER CIRCUITS" now U.S. Pat. No. 5,995,912 issued Sep. 21, 1999. The state of the control input SA determines whether the output Y corresponds to the input A or the input B. Transmission gates 101 and 102 are driven in the opposite phase from the control signal SA and its inverse provided by inverter 111. If the control input SA is 1, then pass gate 101 is turned ON and pass gate 102 is OFF. This couples the input signal B to the input of inverter 112. Similarly, if the control input SA is 0, then pass gate 101 is OFF and pass gate 102 is turned ON coupling the input signal A to the input of inverter 112. In accordance with the prior art all the transistors in the multiplexer of FIG. 1 are HVT devices.

The multiplexer of FIG. 1 could be constructed using all LVT devices. As is known in the art, this would result in a measurable performance improvement. However, the LVT transistors in the transmission gates can create a "sneak path" causing high leakage current. This sneak path is activated when input A is driven high (low) and input B is driven low (high). In this case, leakage current flows through the gate driving A, through both transmission gates 101 and 102, and finally, through the gate driving B. A pure low $V_t$ design should be restricted to cases where either the leakage current is not a design concern or where the inputs A and B almost always have the same logic state.

Figure 2:
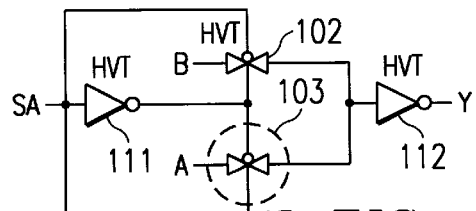
FIG. 2 illustrates a hybrid threshold voltage two input pass gate multiplexer in accordance with an embodiment of this invention.

A hybrid design using both HVT and LVT devices may be advantageously used in pass-gate structures when the control signal SA is almost always in one state. The transmission gate which is often ON is constructed of LVT devices while the transmission gate which is often OFF is constructed of HVT devices. A specific application for this technique is a scan path in registers. The scan input is rarely used and is not speed critical. In contrast, the data input is often used and is speed critical. This is illustrated in FIG. 2, which shows pass gate 105 is constructed of LVT transistors. Pass gate 101 and inverters 111 and 112 are constructed of HVT transistors as in FIG. 1.

Table 1 shows a comparison of the three designs including the pure HVT design, the pure LVT design and the hybrid HVT/LVT design. Parameters for the hybrid HVT/LVT design are given for two conditions, general purpose and biased state design. In the general purpose column, the control signal SA is assumed to be equally likely to be a 1 or a 0. For the biased state column it is assumed that the control signal SA almost always favors one selection and that the pass gate in the unfavored path is constructed on HVT transistors.

TABLE 1

| 1.8 V, 100 MHZ, 40 fF load | HVT | LVT | Hybrid, general purpose | Hybrid, biased states | Units |
|---|---|---|---|---|---|
| Average Power | 7.41 | 7.46 | 7.44 | 7.41 | μW |
| Average Delay | 256 | 242 | 249 | 242 | ps |
| Energy | 1.896 | 1.805 | 1.852 | 1.793 | fJ |
| Leakage Power | 0.38 | 99.43 | 49.9 | 0.38 | nW |

As shown in Table 1 the pure LVT design has an about 5% speed benefit over the pure HVT design. This additional speed is purchased at the expense of a leakage power of more than 250 times larger. This speed increase is probably not worth the leakage power expense. When the hybrid design is used as a general purpose multiplexer it's speed improvement is small. The hybrid design exhibits a far smaller though still significant increase in leakage power than the pure LVT design. When the hybrid design is used in the scan path as described above, it exhibits the low leakage power of the HVT multiplexer and the low propagation-delay characteristic of the LVT design. This emphasizes that careful selection of where to use LVT transistors is key to obtaining an advantage.

Figure 3:
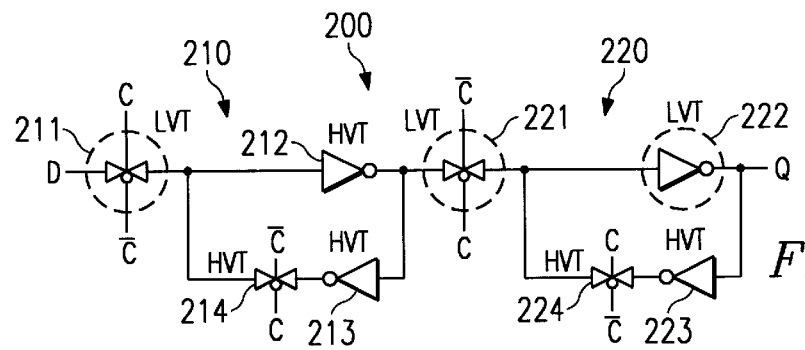
FIG. 3 illustrates a prior art register with some of the high threshold voltage transistors replaced with low threshold voltage transistors.

The performance of a sequential register can also be enhanced by judiciously employing LVT transistors along with HVT transistors. FIG. 3 illustrates a conventional circuit of a negative edge-triggered register 100 according to the prior art with some of the HVT transistors replaced with LVT transistors. This circuit 200 consists of a master latch 2110 and a slave latch 220. Master latch 210 includes an input transmission gate 211 constructed of LVT devices, a first inverter 212, a second inverter 213 and a feedback transmission gate 114. First inverter 212, second inverter 213 and feedback transmission gate 114 are constructed of HVT transistors. The input signal D is supplied to input transmission gate 211 of master latch 210. The output of the master latch 210 supplies the input of the slave latch 220. The slave latch 220 likewise includes an input transmission gate 221 constructed of LVT transistors, a first inverter 222 constructed of LVT transistors, a second inverter 223 and a feedback transmission gate 224. Second inverter 223 and a feedback transmission gate 224 are constructed of HVT transistors. Note that the input transmission gate 211 of master latch 210 is clocked in the opposite phase than the input transmission gate 221 of slave latch 220. Thus these transmission gates conduct on opposite phase of the clock signal C. Inverter 222 of slave latch 220 generates the circuit output signal Q. This circuit illustrated in FIG. 3 can be constructed with 16 MOSFETs.

Using LVT transistors at the data input transmission gate of the master latch cuts down the setup time by about 5%. This circuit may not be desirable if the quiescent supply current $I_{ccq}$ must be low. Note that an $I_{ccq}$ test is often used for an integrated circuit pass/fail measure. This circuit also permits a larger leakage current than a circuit with all HVT transistors when the clock is stopped during the pass-through phase. The forward-driving transmission gate 221 and inverter 222 of slave latch 220 are constructed of LVT devices to speed the critical clock-to-q delay of the latch. This does not produce the "sneak path" described in the previous section. During the pass-through phase of the register 200, both sides of LVT transmission gate 221 of slave latch 220 have the same logic value for significant portion of time during the sampling phase before the input data changes. Assuming 50% of the time a register changes its output, and that the pipeline register's data input generally changes value in the middle of the sampling phase, then the "sneak path" exists for only about $(50\%)^3$ or 12.5% of the time. This reduces the potential for excess leakage current sufficiently that the increase in clock-to-q speed may be worth the additional leakage power.

Figure 4:
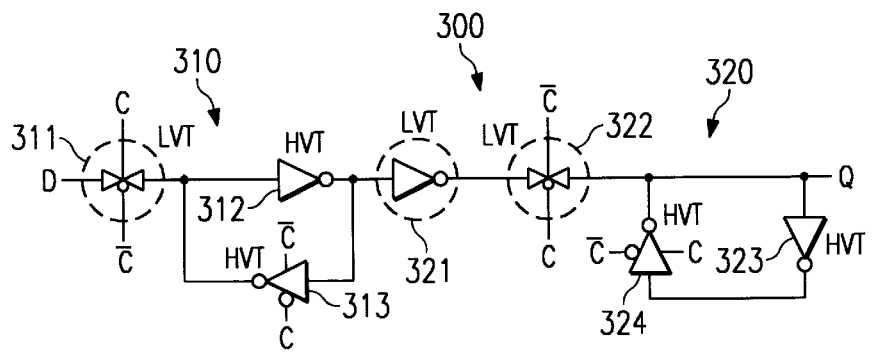
FIG. 4 illustrates a low power split slave dual path register circuit with some of the high threshold voltage transistors replaced with low threshold voltage transistors.

One approach in the prior art to optimize the register for power dissipation is to replace the inverter and transmission gate in the feedback path of the master latch with a tri-state inverter. Another tri-state invertor replaces the inverter and the transmission gate in the feedback path of the slave latch. It is known in the art that an inverter and clocked transmission gate combination are equivalent to a tri-state inverter clocked in the same phase. Such a substitution may be made in all of the circuits described here. FIG. 4 illustrates this low power split slave dual path register circuit 300. The tri-state inverter 313 in the master latch 310 includes the series connection of two P-type MOSFETs and two N-type MOSFETs. The tri-state inverter 324 in the slave latch 320 includes the series connection of a pair of P-type MOSFETs and a pair of N-type MOSFETs. The transmission gate 311, inverter 321 and transmission gate 322 are constructed from LVT transistors. All other circuits consist of HVT transistors. Low-power D split slave dual path flip-flop circuit 300 can be constructed with 18 MOSFETs (note that the tri-state inverters require 4 MOSFETs. Only one of tri-state inverters 313 or 323 is conductive at one time depending upon the polarity of the clock signal C. The conductive tri-state inverter corresponds to the enabled latch. This avoids short-circuit power dissipation in the feedback path.

Figure 5:
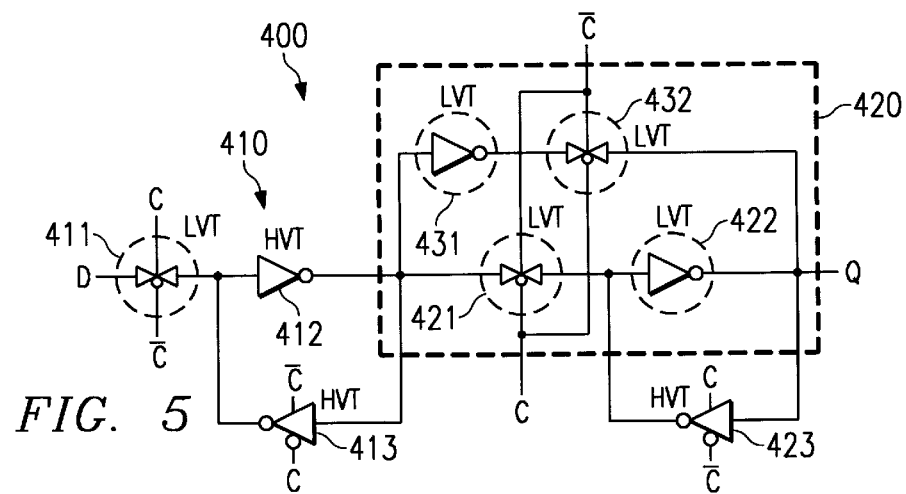
FIG. 5 illustrates a push pull isolation circuit with some of the high threshold voltage transistors replaced with low threshold voltage transistors.

FIG. 5 illustrates a circuit according to another embodiment of the invention. This circuit is called a push pull isolation circuit. The circuit of FIG. 5 is similar to that disclosed in U.S. Pat. No. 5,552,738 issued Sep. 3, 1996 entitled "HIGH PERFORMANCE ENERGY EFFICIENT PUSH PULL D FLIP-FLOP CIRCUITS" and U.S. patent application Ser. No. 08/720,165 filed Sep. 25, 1996 and entitled "NOISE INSENSITIVE HIGH PERFORMANCE ENERGY EFFICIENT PUSH PULL ISOLATION FLIP-FLOP CIRCUITS" now U.S. Pat. No. 5,767,716 issued Jun. 16, 1998 with the exception of the provision of LVT transistors. To optimize for speed, an inverter 431 and a transmission gate 432 are added between outputs of master latch 410 and slave latch 420. This accomplishes a push-pull effect at slave latch 420. This adds four MOSFETs, but reduces the clock-to-output (C-to-Q) delay by reducing the gate depth from two gates in the regular register circuit 200 illustrated in FIG. 3 to one gate. There are four added MOSFETs in the push-pull circuit for a total of 20 transistors. FIG. 5 illustrates that transmission gates 411 and 421, inverters 422 and 431 and transmission gate 432 are constructed of LVT transistors. All other circuits are constructed of HVT transistors.

Table 2 shows a comparison of the three proposed register designs of FIGS. 3, 4 and 4. These three designs are the hybrid $V_t$ conventional circuit of FIG. 3, the hybrid $V_t$ split slave dual path circuit of FIG. 4 and the hybrid $V_t$ push pull isolation circuit of FIG. 5. These figures are from simulations assuming a supply voltage $V_{dd}$ of 1.8 V, an operating frequency of 100 MHZ and an output of five standard loads.

TABLE 2

| 1.8 V, 100 Hz, Fanout of 5 standard loads | Hybrid $V_t$ Conventional circuit | Hybrid $V_t$ split slave dual path | Hybrid $V_t$ push pull isolation | Units |
|---|---|---|---|---|
| Number of transistors | 16 | 18 | 20 | tr. |
| Total transistor width | 36.2 | 39.5 | 39.2 | $\mu$m |
| Average Power | 23.13 | 21.99 | 23.54 | $\mu$W |
| percentage | 98.3 | 93.4 | 100 | % |
| Clock to Q delay | 62.34 | 41.73 | 32.47 | ps |
| percentage | 192 | 129 | 100 | % |
| Energy | 1.441 | 0.917 | 0.764 | fJ |
| percentage | 189 | 120 | 100 | % |
| Leakage power | 170.6 | 157.3 | 171.2 | nW |
| percentage | 99.6 | 92 | 100 | % |

The percentage comparisons in Table 2 are all based upon the hybrid $V_t$ push pull isolation register circuit as reference. Both hybrid $V_t$ split slave dual path register 300 and hybrid $V_t$ push pull isolation register 400 employ a tri-state feedback inverter that reduces short-circuit power. Thus the hybrid $V_t$ split slave dual path register 300 dissipates about 5% less power than hybrid $V_t$ conventional circuit register 200. The hybrid $V_t$ push pull isolation register 400 has one additional transmission gate connected to the output signal Q to perform the push-pull effect, hence dissipates 6% more power than hybrid $V_t$ split slave dual path register 300. The hybrid $V_t$ push pull isolation register 400 is 92% faster than the hybrid $V_t$ conventional circuit register due the only one gate delay from clock to output of the hybrid $V_t$ push pull isolation register 400. The hybrid $V_t$ push pull isolation register 400 is 29% faster than the hybrid $V_t$ split slave dual path register 300. This is primarily due to the dual current paths in hybrid $V_t$ push pull isolation register 400 while there is only one in the hybrid $V_t$ split slave dual path register 300 with limited driving capability as a result of the serial transmission gate. With the power-delay product as the metric to the energy consumption, the energy efficiency of hybrid $V_t$ push pull isolation register 400 is 89% better than that of the hybrid $V_t$ conventional circuit register 200 and 20% better than that of the hybrid $V_t$ split slave dual path register 300. Under the worst case of a 100% input data toggle condition, leakage power of the three hybrid $V_t$ registers are comparable and within an 8% range.

FIG. 6 illustrates the effect of differing loadings on the clock to output delay time of the registers 200, 300 and 400. As shown, the delay time of hybrid $V_t$ push pull isolation register 400 is the best for all loadings. The delay time of hybrid $V_t$ push pull isolation register 400 is from about half to about two thirds of that of the hybrid $V_t$ conventional circuit register 200, depending on the loading. The delay time of hybrid $V_t$ push pull isolation register 400 is from about equal to about 80% of that of the hybrid $V_t$ split slave dual path register 300, depending on the loading.

FIGS. 7 and 8 illustrate alternative constructions of the slave latch 420 which may be substituted into the hybrid $V_t$ push pull isolation register 400 illustrated in FIG. 5. In FIG. 7, only the transmission gates 421 and 432 are constructed of LVT transistors. The inverters 441 and 442 are constructed on HVT transistors. In FIG. 8, only the inverters 431 and 422 are constructed of LVT transistors and the transmission gates 451 and 452 are constructed of HVT transistors.

Figure 10:
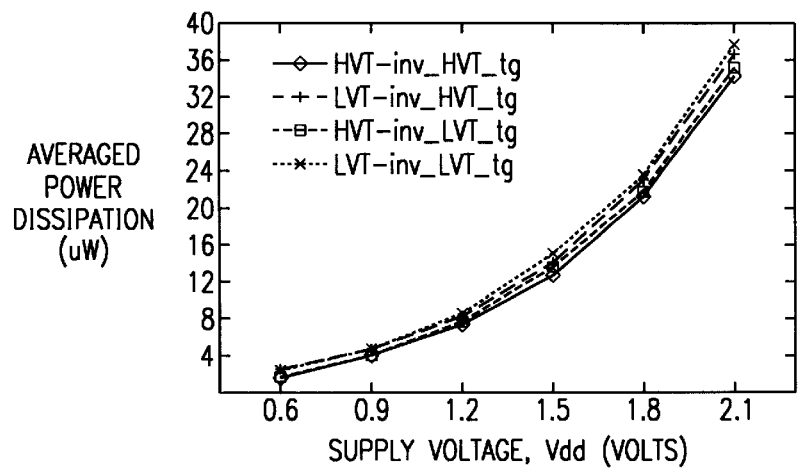
FIG. 10 is a graph illustrating the effect of scaling the supply voltage on the average power dissipation of registers of this invention.
Figure 11:
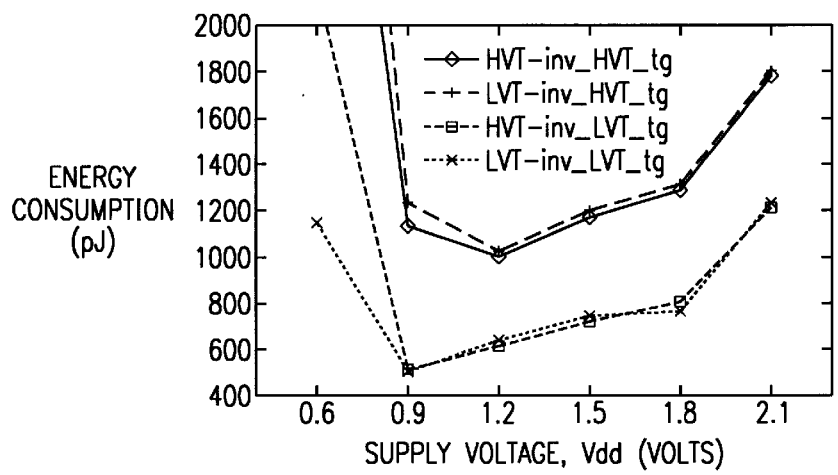
FIG. 11 is a graph illustrating the effect of scaling the supply voltage on the energy consumption expressed of registers of this invention.

The effect of scaling the supply voltage $V_{dd}$ on the known push pull isolation register and its hybrid $V_t$ derivatives are shown in FIGS. 9 to 11. Each of these figures shows four lines. The first line is designated "HVT-inv__HVT-tg" indicating that both the inverters and the transmission gates in the slave latch 420 are constructed of HVT transistors. This is the known circuit of U.S. Pat. No. 5,552,738 and U.S. patent application Ser. No. 08/720,165 filed Sep. 25, 1996 cited above. The second line is designated "LVT-inv__HVT-tg" indicating that the inverters are constructed of LVT transistors and the transmission gates are constructed of HVT transistors. This is the construction illustrated in FIG. 8. The third line is designated "HVT-inv__LVT-tg" indicating that the inverters are constructed of HVT transistors and the transmission gates are constructed of LVT transistors. This is the construction illustrated in FIG. 7. The fourth line is designated "LVT-inv__LVT-tg" indicating that both the inverters and the transmission gates are constructed of LVT transistors. This is the construction illustrated in FIG. 5.

FIG. 9 illustrates the effect of scaling the supply voltage $V_{dd}$ from 0.9 to 2.1 V on the clock-to-q delay expressed in picoseconds. FIG. 9 illustrates that changing only the inverters from HVT to LVT improves the speed by a factor of 7–10%, while changing only the transmission gates from HVT to LVT can enhance the speed by a much higher factor of 76–82%. Changing the inverters from HVT transistors to LVT transistors does not change the inverter gate threshold though it does increase the inverter current driving capability. However, changing the transmission gates from HVT transistors to LVT transistors enables the transmission gate to turn on much earlier.

FIG. 10 illustrates the effect of scaling the supply voltage $V_{dd}$ on the average power dissipation expressed in nano-Watts. FIG. 10 shows that though the more LVT MOSFETs used the more the power dissipation, the dynamic power of the four circuits are within 10–15%. Thus the threshold voltage has little effect on the average power of the push-pull isolation register.

FIG. 11 illustrates the effect of scaling the supply voltage $V_{dd}$ on the energy consumption expressed in picoJoules. FIG. 11 illustrates that the energy efficiency can be improved by an average factor of about 1.73 times by simply constructing the transmission gates of LVT transistors if the lowest operating supply voltage $V_{dd}$ is 0.9 V and the lowest quiescent current $I_{ccq}$ is the priority (see Table 3). If the focus is on high-performance at a supply voltage $V_{dd}$ of 0.6 V then having both the inverters and the transmission gates constructed of LVT transistors will be most desirable. This is achieved at an expense of 135 times of the quiescent current $I_{ccq}$.

Table 3 shows the quiescent current $I_{ccq}$ at a supply voltage $V_{dd}$ of 1.8 V. The quiescent current $I_{ccq}$ comes primarily from leakage in transistors that are turned OFF. Table 3 makes it apparent that the quiescent current $I_{ccq}$ is greatly increased by constructing the inverters of LVT transistors. Constructing the transmission gates of LVT transistors does not change the quiescent current $I_{ccq}$.

TABLE 3

| 1.8 V | HVT-inv HVT-tg | LVT-inv HVT-tg | HVT-inv LVT-tg | LVT-inv LVT-tg | Units |
|---|---|---|---|---|---|
| $I_{ccq}$ | 703.9 | 95115 | 703.9 | 95115 | pA |

Figure 12:
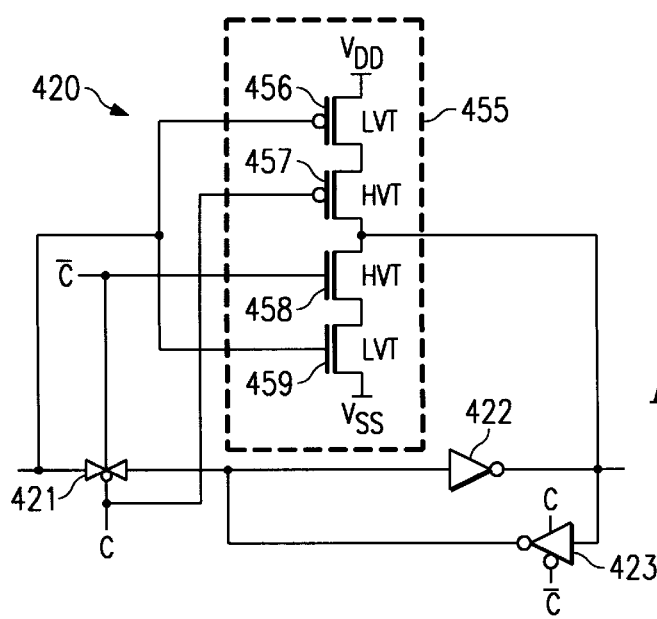
FIG. 12 illustrates a further alternative construction of the slave latch of the push-pull isolation register illustrated in FIG. 5.

FIG. 12 illustrates another variation of slave latch of the hybrid $V_t$ register of FIG. 5. In FIG. 12 the inverter 431 and the transmission gate 432 are replaced with a hybrid $V_t$ tri-state inverter 455. The hybrid tri-state inverter 455 includes P-channel MOSFETs 451 and 452, and N-channel MOSFETs 415 and 416. P-channel MOSFET 457 and N-channel MOSFET 458 are HVT transistors. P-channel MOSFET 456 and N-channel MOSFET 459 are LVT transistors.

Figure 13:
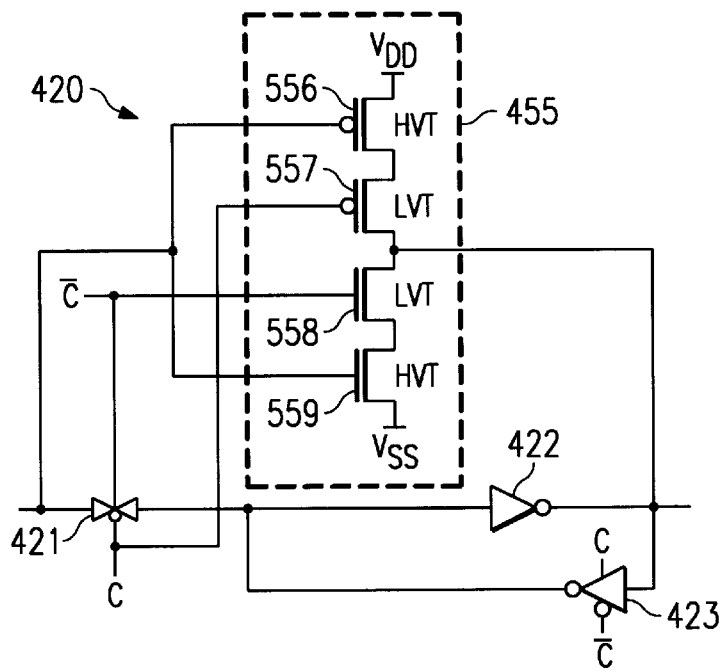
FIG. 13 illustrates an alternative to the construction of FIG. 12.
Figure 14:
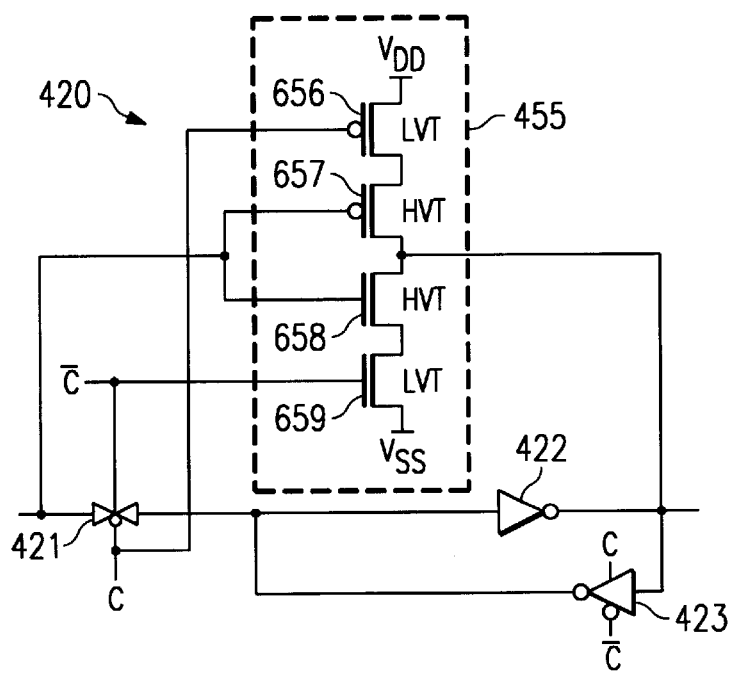
FIG. 14 illustrates a second alternative to the construction of FIG. 12.
Figure 15:
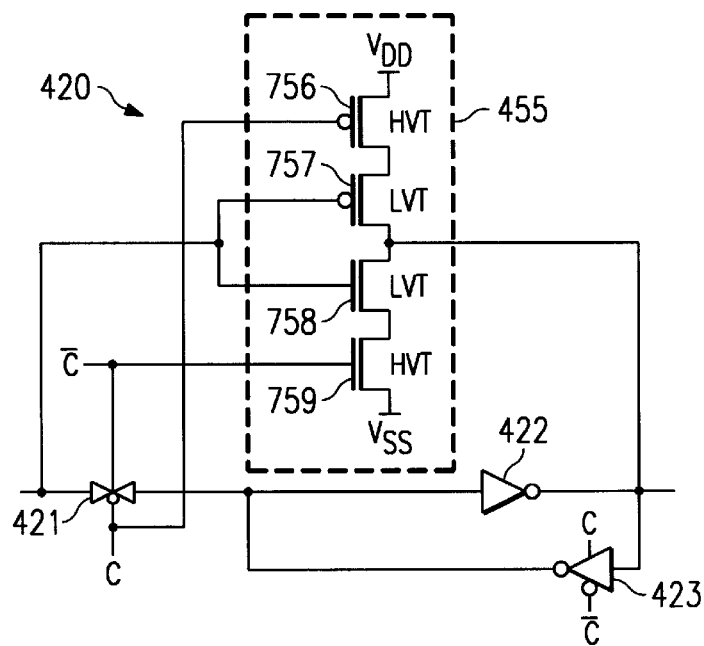
FIG. 15 illustrates a third alternative to the construction of FIG. 12.

FIGS. 13, 14 and 15 illustrate variations on the construction of the tri-state inverter of FIG. 12. FIG. 13 illustrates a first alternative of the tri-state inverter of FIG. 12. In FIG. 13 the threshold voltage of each transistor is reversed in relationship to that of the corresponding transistor in FIG. 12. Thus P-channel transistor 557 has the low threshold voltage, P-channel transistors 556 has the high threshold voltage, N-channel transistors 559 has the high threshold voltage and N-channel transistors 558 has the low threshold voltage. These two alternatives are selected based upon the relative switching speed desired between the clock signal and the push-pull signal. If the fastest switching speed is desired for the push-pull signal, then the alternative of FIG. 12 is selected. In FIG. 12 the push-pull signal drives the gates of the LVT transistors which switch faster. If the fastest switching speed is desired for the clock signal, then the alternative of FIG. 13 is selected in which the clock signal drives the gates of the LVT transistors.

The alternative multiplexer of FIG. 14 is similar to that of FIG. 12, except that the relative order of the transistors has been switched. Thus the clock signal drives the gates of the outer transistors 656 and 659 and the push-pull signal drives the gates of the inner transistors 657 and 658. The selection between the alternatives in FIGS. 12 and 14 depends upon the expected arrival times of the input and control signals. It is believed best if the last arriving signal drives the inner transistors. Thus the alternative of FIG. 12 should be selected if the clock signal are expected to switch after the push-pull signal. On the other hand, the alternative illustrated in FIG. 14 should be selected if the push-pull signal is expected to switch after the clock signal.

The final alternative is illustrated in FIG. 15. This alternative is similar to FIG. 13 except that the relative order of the transistors has been switched. In FIG. 15 the push-pull signal drives the inner transistors 757 and 758 and the clock signal drives the inner transistors 756 and 759. Selection between the alternatives of FIGS. 13 and 15 is based upon the expected arrival times of the input and control signals as described above.

Figure 16:
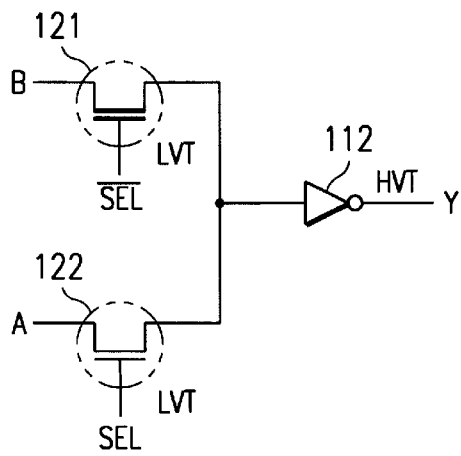
FIG. 16 illustrates a first complementary pass-transistor logic alternative to the circuit of FIG. 2.
Figure 17:
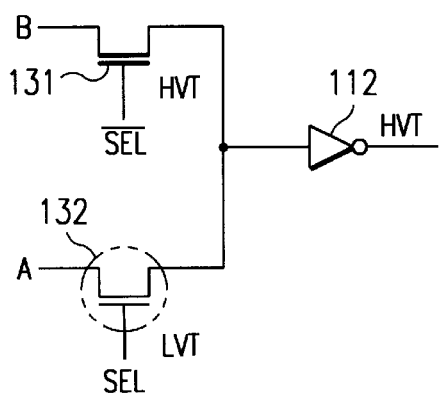
FIG. 17 illustrates a second complementary pass-transistor logic alternative to the circuit of FIG. 2.

FIGS. 16 and 17 illustrate alternatives to the circuit of FIG. 2. In FIGS. 16 and 17, the transmission gates are replaced with a single N-channel transistor. This is called complementary pass-transistor logic (CPL). These two N-channel transistors could both be LVT transistors as shown at 121 and 122 of FIG. 16. These two N-channel transistors could be of different threshold voltages as HVT transistor 131 and LVT transistor 132 of FIG. 17.

What is claimed is:

1. A two in put multiplexer comprising:
   a first transmission gate having a first input receiving a first input signal, a first output node and receiving a control signal in a first phase, said first transmission gate constructed of transistors having a first threshold voltage;
   a second transmission gate having a second input receiving a second input signal, a second output node connected to said first output node and receiving said control signal in a second phase opposite to said first phase, said second transmission gate constructed of transistors having a second threshold voltage lower than said first threshold voltage; and
   an inverter having an input connected to said first and second output nodes and an output forming an output of said multiplexer.

2. The two input multiplexer of claim 1, wherein:
   said control signal has a first state and a second state, when said control signal having said first state said control signal is in said first phase selects said first input signal via said first transmission gate more often than having said second state, in which said control signal is in said second phase selects said second input signal via said second transmission gate.

3. The two input multiplexer of claim 1, further comprising:
   a second inverter having an input receiving said control signal and an output generating an inverse of said control signal; and
   wherein said first and second transmission gates have respective first and second control inputs, said first transmission gate receiving said control signal in said first phase by receiving said control signal at said first control input and receiving said inverse of said control signal from said second inverter at said second control input, and said second transmission gate receiving said control signal in said second phase by receiving said inverse control signal from said second inverter at said first control input and receiving said control signal at said second input.

4. A two input multiplexer comprising:
   a first N-channel transistor having a source-drain path connected between a first input signal and an intermediate node, and a gate receiving a first control signal;
   a second N-channel transistor having a source-drain path connected between a second input signal and said intermediate node, and a gate receiving a second control signal; and
   an inverter having an input connected to said intermediate nodes and an output forming an output of said multiplexer, said inverter constructed of transistors having a first threshold voltage;
   wherein at least one of said first and second N-channel transistors is constructed having a second threshold voltage less than said first threshold voltage.

5. The two input multiplexer of claim 4, wherein:
   said second control signal is an inverse of said first control signal.

6. The two input multiplexer of claim 5, further comprising:
   a second inverter having an input receiving said control signal and an output generating said inverse of said control signal.

7. The two input multiplexer of claim 5, wherein:
   said first N-channel transistor is constructed having said first threshold voltage;
   said second N-channel transistor is constructed having said second threshold voltage; and
   said control signal and said inverse of said control signal have respective states selecting said second input signal via said second N-channel transistor more often than selecting said first input signal via said first N-channel transistor.

8. The two input multiplexer of claim 4, wherein:
   said both first and said second N-channel transistors are constructed having said second threshold voltage.

* * * * *